US008666350B2

United States Patent
(12) United States Patent
Vauhkonen

(10) Patent No.: US 8,666,350 B2
(45) Date of Patent: Mar. 4, 2014

(54) ANALOG FRONT END CIRCUIT FOR CABLE AND WIRELESS SYSTEMS

(75) Inventor: Ari Vauhkonen, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 118 days.

(21) Appl. No.: 12/954,598

(22) Filed: Nov. 24, 2010

(65) Prior Publication Data

US 2011/0294448 A1 Dec. 1, 2011

Related U.S. Application Data

(60) Provisional application No. 61/263,956, filed on Nov. 24, 2009.

(51) Int. Cl.
*H04B 1/10* (2006.01)

(52) U.S. Cl.
USPC ........... 455/307; 455/130; 455/134; 455/135; 455/136; 327/352

(58) Field of Classification Search
USPC ......... 455/130, 134, 135, 136–138, 207, 209, 455/219, 232.1, 245.1, 251.1, 306, 307; 327/352
See application file for complete search history.

(56) References Cited

U.S. PATENT DOCUMENTS

| | | | | |
|---|---|---|---|---|
| 5,758,271 | A * | 5/1998 | Rich et al. | 455/234.1 |
| 8,009,776 | B2 * | 8/2011 | Gao et al. | 375/345 |
| 2003/0162543 | A1 | 8/2003 | Auranen et al. | |
| 2008/0290966 | A1 | 11/2008 | Darabi et al. | |
| 2009/0137213 | A1 | 5/2009 | Rofougaran et al. | |
| 2009/0221259 | A1 * | 9/2009 | Shiramizu et al. | 455/334 |
| 2010/0022211 | A1 * | 1/2010 | Huang | 455/232.1 |

OTHER PUBLICATIONS

International Search Report and Written Opinion for Patent Application PCT/US2010/058121, mailed on Feb. 11, 2011, 11 pages.
International Preliminary Report on Patentability with Written Opinion for PCT Application No. PCT/US2010/058121, mailed Jun. 7, 2012; 6 pages.

* cited by examiner

*Primary Examiner* — Tuan Pham
(74) *Attorney, Agent, or Firm* — Ardeshir Tabibi, Esq.; Kilpatrick Townsend Stockton LLP

(57) ABSTRACT

A circuit includes, an attenuator responsive to an input signal and a feedback signal, a variable gain low-noise amplifier responsive to the attenuator and to the feedback signal, a tracking filter, a frequency converter, and an RSSI responsive to the variable gain amplifier to generate an output signal to which the feedback signal is responsive. The frequency converter may be a mixer having a single-ended input and a differential output. The circuit may further include an analog baseband block responsive to the mixer to filter out high frequency signals. The tracking tuner performs bandpass filtering operation on the output signals of the variable gain low-noise amplifier.

20 Claims, 2 Drawing Sheets

100 106 104 102 200 IN Attenuator 114 Attenuator LNA $O_1$ $O_2$ $N_1$ $170_1$ $170_2$ $170_N$ 150 $160_1$ $160_2$ $160_N$ $B[B_1...B_N]$ Analog Baseband I Q 108 178 175 Lo $S_2$ C RSSI 110 $S_1$ FB A-to-D Converter 302 Digital Signal Processor 304 Memory 306

ANALOG FRONT END CIRCUIT FOR CABLE AND WIRELESS SYSTEMS

CROSS-REFERENCES TO RELATED APPLICATIONS

The present application claims benefit under 35 USC 119(e) of U.S. provisional application No. 61/263,956, filed Nov. 24, 2009, entitled "Cable Architecture for Cable and Analog TV," the content of which is incorporated herein by reference in its entirety.

BACKGROUND OF THE INVENTION

The present invention relates to communication systems, and more particularly to an analog front end circuit used in communication systems.

Conventional analog front end circuits use a relatively large number of electrical components and thus are expensive and have a relatively high power consumption.

BRIEF SUMMARY OF THE INVENTION

A circuit, in accordance with one embodiment of the present invention, includes, in part, an attenuator responsive to a feedback signal and an input signal, a variable gain amplifier responsive to the attenuator and to the feedback signal, a tracking filter, a frequency converter, and a receive signal strength indicator (RSSI) responsive to the variable gain amplifier to generate an output signal to which the feedback signal is responsive.

In one embodiment, the frequency converter is a mixer having a single-ended input terminal and a differential output terminal. In one embodiment, the circuit further includes an analog baseband block responsive to the mixer and adapted to filter out high frequency signals. In one embodiment, the tracking tuner, which performs band-pass filtering operation, includes an inductor, N capacitors, N first switches, a current source, and a second switch. The inductor is coupled between a first node and a second node coupled to an output terminal of the variable gain amplifier. Each of the N capacitors has a terminal coupled to the first node. Each of the N first switches is associated with a different one of the N capacitors, with each of the N first switches being adapted to couple a second terminal of its associated capacitor to the second node when closed. The current source has a first terminal coupled to a third node. The second switch is adapted to enable a current to flow from the second node to the third node when it is closed.

In one embodiment, the circuit further includes a baseband processor responsive to the RSSI and the analog baseband block to generate the feedback signal. In one embodiment, the baseband processor is adapted to close the second switch and close the N first switches using a predefined sequence when a channel change occurs so as to determine switch positions that cause a highest amplitude at the output of the analog baseband block.

In one embodiment, the variable gain amplifier is a variable gain low-noise amplifier. In one embodiment, the variable gain low-noise amplifier further includes an attenuator whose attenuation level is varied in response to the feedback signal. In one embodiment, the mixer includes a first input terminal receiving an output signal of the variable gain amplifier and a second input terminal that floats. In one embodiment, the baseband processor includes an analog-to-digital converter and a memory.

A method of converting an RF signal to a baseband signal, in accordance with one embodiment of the present invention, includes, in part, attenuating the RF signal in response to a feedback signal to generate a first signal, amplifying the first signal in response to the feedback signal to generate a second signal, bandpass filtering the second signal to generate a third signal, and converting a frequency of the third signal from RF to baseband to generate a fourth signal, and generating the feedback signal in response to the second signal.

In one embodiment, the method further includes using a mixer that has a single-ended input and a differential output to convert the frequency of the third signal. In one embodiment, the method further includes filtering out high frequency signals from the fourth signal to generate a fifth signal. In one embodiment, the band-pass filtering operation is performed using a tracking filter that includes, in part, an inductor coupled between a first node and a second node, N capacitors each having a terminal coupled to the first node, N first switches each associated with a different one of the N capacitors, each of the N first switches adapted to couple a second terminal of its associated capacitor to the second node when closed, a current source having a first terminal coupled to a third node, and a second switch adapted to enable a current to flow from the second node to the third node when it is closed.

In one embodiment the method further includes using a baseband processor to generate the feedback signal in response to the second and fifth signals. In one embodiment, the baseband processor is adapted to close the second switch and the N first switches using a predefined sequence, when a channel change occurs, so as to determine switch positions that cause a highest amplitude for the fifth signal. In one embodiment, the method further includes using a variable gain low-noise variable gain amplifier to amplify the first signal. In one embodiment, the variable gain low-noise amplifier includes an attenuator whose attenuation level is varied in response to the feedback signal. In one embodiment, the mixer includes a first input terminal receiving an output signal of the variable gain amplifier and a second input terminal that floats. In one embodiment, the baseband processor further includes an analog-to-digital converter and a memory.

DETAILED DESCRIPTION OF THE INVENTION

Figure 1:
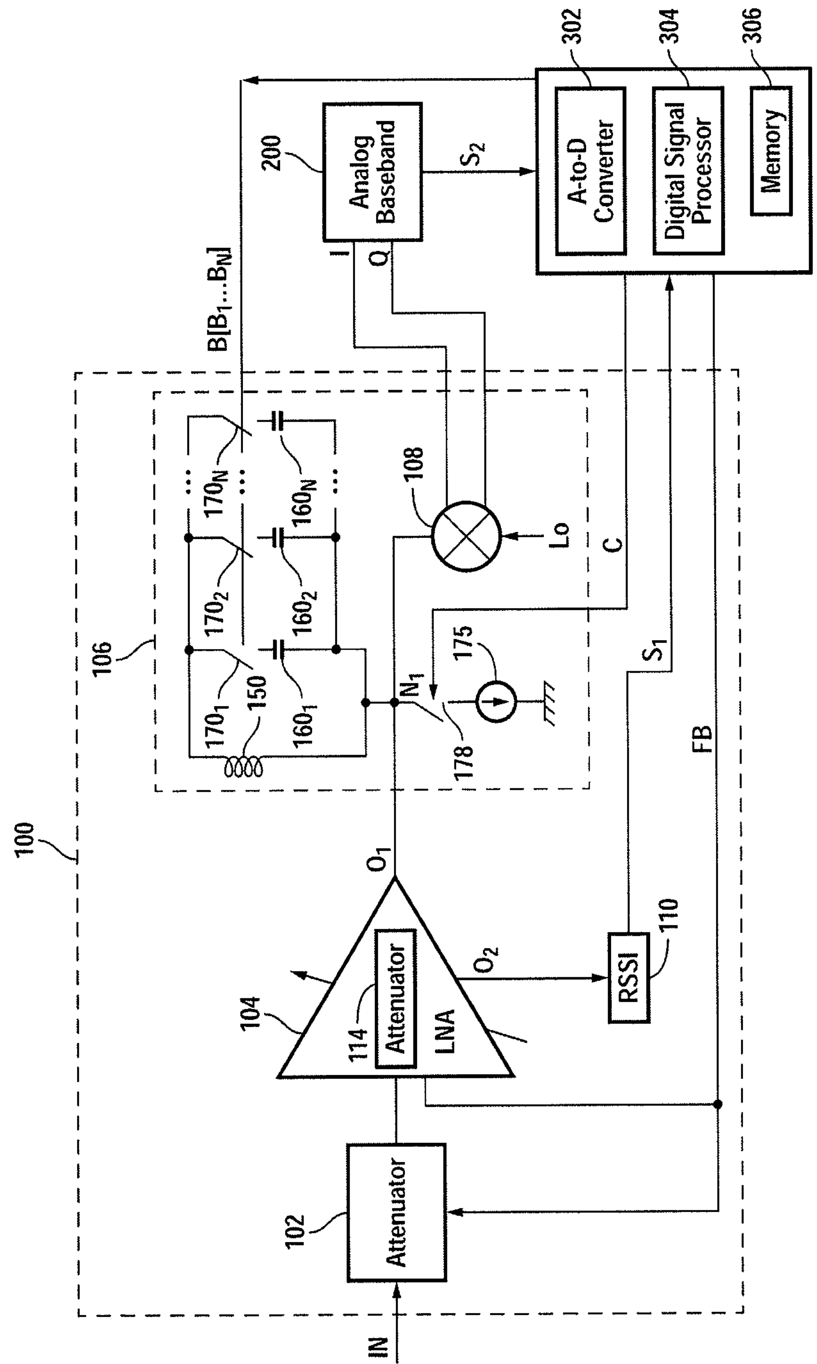
FIG. 1 shows an analog front end circuit, in accordance with one embodiment of the present invention.

FIG. 1 is a block diagram of an exemplary analog front end (AFE) circuit 100, in accordance with one embodiment of the present invention, that is in communication with analog baseband block 200 and digital baseband processor 300. AFE 100 is shown as including an attenuator 102, an amplifier 104, a tracking filter 106, a mixer 108 and a received signal strength indicator 110.

Attenuator 102 is adapted to attenuate the signals it receives at its input terminal IN. The input signal to attenuator 102 is an RF signal received either via an antenna of a wireless receiver or a cable coupled to its input terminal IN. Attenuator 102 attenuates the signals it receives so as to maintain the dynamic range of the receiver in which AFE 100 is disposed constant.

Amplifier 104 is a variable gain amplifier configured to amplify the signal it receives from attenuator 102. In embodiment 100 of the AFE, variable gain amplifier 104 is shown as being a variable gain low noise amplifier (LNA). The gain of LNA 104 is controlled via a feedback signal FB generated by baseband processor 300, as described further below. It is understood that feedback signal FB is a multi-bit signal. Output signal O1 of LNA 104 is applied to mixer 108. Output signal O2 of LNA 104 is applied to RSSI 110 and has the same frequency as signal O1.

RSSI 110 is adapted to detect the strength of signal O2 and supply the result of this detection to baseband processor 300. If the strength of signal O2 is detected as being greater than the upper bound of a predetermined threshold window, baseband processor 300 increases the value of feedback signal FB so as to increase the attenuation level of attenuator 102. If the strength of signal O2 is detected as being smaller than the lower bound of the predetermined threshold window, baseband processor 300 decreases signal FB so as to increase the attenuation level value of feedback signal FB. The value of feedback signal FB does not change if the strength of signal O2 is detected as being within the threshold window.

The output signal O1 of the LNA amplifier 104 is applied to frequency conversion block 108. Frequency conversion block 108 is shown as being a mixer but may be any other frequency conversion block that downconverts the frequency of the signal it receives. Mixer 108 is a direct conversion mixer that converts the received RF signal to a baseband signal centered around zero frequency. Mixer 108 is shown as having a single-ended input and a differential output supplying an in-phase output signal I, and a quadrature output signal Q that is shifted 90° relative to the I signal. The output signals of mixer 108 are applied to analog baseband block 200. Due to single ended structure of attenuator 102 and LNA 104, no on-board balun is needed, thereby lowering the cost and size of the AFE. The input impedance of attenuator 102 is designed to be substantially constant, which in turn, minimizes any disturbance on the cable that supplies signal IN to the attenuator.

Figure 3:
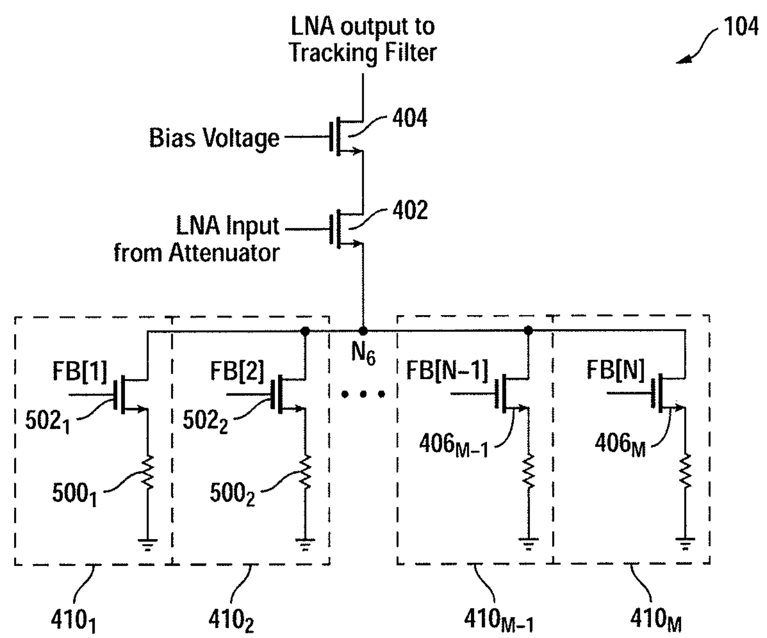
FIG. 3 is a schematic diagram of the attenuator disposed in the LNA of the analog front end circuit of FIG. 1, in accordance with one embodiment of the present invention.

AFE 100 is further shown as including an attenuator 114 disposed in LNA 104 and whose attenuation level is also controlled by the feedback signal FB. Therefore the attenuation levels of both attenuators 102 and 114 are controlled by signal FB generated by baseband processor 300. In one embodiment, attenuator 114 includes a common-source amplifier with a source degeneration resistor, as shown in FIG. 3. The feedback signal FB expands the dynamic range of attenuator 114 and ensures that LNA 104 operates in a linear region without affecting the noise in the LNA. In one example, each dB of attenuation in attenuator 114 causes an increase of 0.5 dB in the noise figure of LNA 104 and enhances linearity of LNA 104 by 2 dB.

Analog baseband block 200 is a low-pass filter adapted to filter out the undesired signals it receives from mixer 108. The output signal S2 of analog baseband block 200, which is an analog signal centered around the DC, is delivered to digital baseband processor 300. As is known, to select a different channel, the LO frequency is changed and analog baseband block 200 passes the selected channel frequency to its output terminal.

Baseband processor 300 is adapted to generate signals FB, C and B in response to receiving output signal S1 of RSSI 110, and output signal S2 of analog baseband block 200. Signal S2 is converted to a digital signal using analog-to-digital (A-to-D) converter 302 disposed in baseband processor 300. Baseband processor 300 is adapted to increase (decrease) the value of feedback signal FB as signal S1 increases (decreases). Likewise, baseband processor 300 is adapted to increase (decrease) the value of feedback signal FB as signal S2 increases (decreases). As described above, signal S2 is the desired signal and is centered around the DC, whereas signal S1 contains the desired signal as well as other signals, including the blocker signals, that are received by AFE 100. Signal C generated by baseband processor 300 is used to open and close switch 178 of tracking filter 106. Signal B which is an N-bit signal is used to open and close N switches $\mathbf{170}_1$, $\mathbf{170}_2$ . . . $\mathbf{170}_N$ of tracking filter 106, as described further below.

Tracking filter 106 is a bandpass filter that filters out the undesired signals present at the output of amplifier 104. Tracking filter 106 is shown as including inductor 150, switches $\mathbf{170}_1$, $\mathbf{170}_2$ . . . $\mathbf{170}_N$, capacitors $\mathbf{160}_1$, $\mathbf{160}_2$ . . . $\mathbf{160}_N$, switch 178 and RF current source 175. Capacitors $\mathbf{160}_1$, $\mathbf{160}_2$ . . . $\mathbf{160}_N$ may have the same capacitance or may have different capacitances. Inductor 150 and capacitors $\mathbf{160}_1$, $\mathbf{160}_2$ . . . $\mathbf{160}_N$ form an LC tank that causes a voltage to be generated at node N1 when the switches $\mathbf{170}_1$, $\mathbf{170}_2$ . . . $\mathbf{170}_N$ close in response to output signal B of baseband processor 300 when a new channel is selected, as described further below.

Tracking filter 106 is adapted to automatically perform calibration when a different channel is selected. To achieve this, when a new channel is selected, switch 178 is closed so as to enable calibration current to flow through the LC tank. Baseband processor closes switches $\mathbf{170}_1$, $\mathbf{170}_2$ . . . $\mathbf{170}_N$ (using signals $B_1$, $B_2$ . . . $B_N$) sequentially, in one embodiment, until the amplitude of the signal at node N1, as determined by the output value of A-to-D converter 302, reaches a maximum value. In another embodiment, any number of switches 170 may be open or closed at any given time, depending, in part, for example, on the capacitances of capacitors 160, to determine the combination of switch positions that causes analog baseband block 200 to generate the highest amplitude at its output.

The calibration process is performed once every time a new channel is selected. After the calibration cycle is completed, baseband processor 300 opens switch 178. In one embodiment, the frequency of the current in current source 175 is the local oscillator (LO) frequency plus, for example, 2.25 MHz. Tracking filter 106 increases the linearity of mixer 108 and analog baseband block 200, and further enables a seamless operation by the user.

Figure 2:
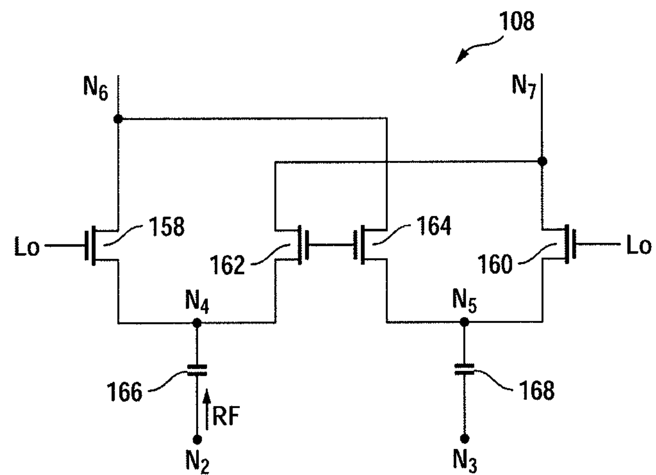
FIG. 2 is a schematic diagram of the mixer disposed in the analog front end circuit of FIG. 1, in accordance with one embodiment of the present invention.

FIG. 2 is a transistor schematic diagram of mixer 108. As shown, mixer 108 is shown as including four NMOS transistors 158, 160, 162, 164 forming a Gilbert cell. Input RF signal is received by node N2 and delivered to transistors 158, 162. Node N3 to which transistors 164 and 160 are coupled remains floating in some applications. In other applications, node N3 receives a resistive load so that the impedance seen at node N3 matches the impedance seen at node N2. Mixer 108 performs single-ended to differential conversion with minimal noise from the LO path. Capacitor 166 is connected between nodes N2 and N4. Capacitor 168 is connected between nodes N3 and N5. Output signals of the mixer, that are baseband signals, are delivered at nodes N6 and N7.

As described above, digital baseband processor 300 includes an analog-to-digital (A-to-D) converter 302 which digitizes the analog baseband signal S2 it receives from analog baseband block 200. Digital baseband processor 300 also includes a digital signal processor 304 which receives the output of A-to-D converter 302 and the output signal S1 of RSSI 110, and generates in response, the feedback control signal FB used to control the attenuation levels of attenuator 102 and 114. Digital signal processor 304 also generates output signal B which is a word (a multi-bit signal) controlling switches $\mathbf{170}_1$, $\mathbf{170}_2$ . . . $\mathbf{170}_N$ of tracking filter 106.

FIG. 3 is a transistor schematic diagram of LNA 104, in accordance with one embodiment of the present invention. LNA 104 is shown as including NMOS transistors 402, 404, as well as M variable resistive stages 410 that collectively form a cascode common-source amplifier with source degeneration. Transistors 402 and 404 form a form of a cascode common-source amplifier. Each variable resistive stage 410 includes a transistor and a resistor, as shown. For example, variable resistive stage $\mathbf{410}_1$ is shown as including resistor $\mathbf{500}_1$ and transistor $\mathbf{502}_1$. The gate of each transistor 502 receives a different one of the bits of feedback signal FB and is thus activated when that bit is set to a high value. For example, when bit 1 of signal FB is set to a high level by baseband processor 300, transistor $\mathbf{502}_1$ turns on thus enabling common node N6 to be connected to the ground terminal via resistor $\mathbf{500}_1$. Accordingly, depending on the bit values of the feedback signal FB, one or more of the transistors 502 are enabled to vary the resistance between node N6 and the ground.

The above embodiments of the present invention are illustrative and not limitative. Various alternatives and equivalents are possible. Other additions, subtractions or modifications are obvious in view of the present invention and are intended to fall within the scope of the appended claim.

What is claimed is:

1. A circuit comprising:

an attenuator responsive to a feedback signal and an input signal;

a variable gain amplifier responsive to the attenuator and to the feedback signal;

a tracking filter comprising:

an inductor coupled between a first node and a second node; said first node being coupled to an output terminal of the variable gain amplifier;

N capacitors each having a terminal coupled to the first node;

N first switches each associated with a different one of the N capacitors, each of the N first switches adapted to couple a second terminal of its associated capacitor to the second node when closed;

a frequency converter;

a receive signal strength indicator (RSSI) responsive to the variable gain amplifier to generate an output signal to which the feedback signal is responsive.

2. The circuit of claim 1 wherein said frequency converter is a mixer having a single-ended input terminal and a differential output terminal.

3. The circuit of claim 1 further comprising:

an analog baseband block responsive to the mixer and adapted to filter out high frequency signals.

4. The circuit of claim 2 wherein said tracking filter comprises:

a current source having a first terminal coupled to a third node; and a second switch adapted to enable a current to flow from the second node to the third node when it is closed.

5. The circuit of claim 4 further comprising:

a baseband processor responsive to the RSSI and the analog baseband block to generate the feedback signal.

6. The circuit of claim 5 wherein said baseband processor is adapted to close the second switch and the N first switches in a predefined sequence when a channel change occurs so as to determine switch positions that cause a highest amplitude at the output of the analog baseband block.

7. The circuit of claim 6 wherein said variable gain amplifier is a variable gain low-noise amplifier.

8. The circuit of claim 7 wherein the variable gain low-noise amplifier further comprises an attenuator whose attenuation level is varied in response to the feedback signal.

9. The circuit of claim 2 wherein said mixer comprises a first input terminal receiving an output signal of the variable gain amplifier and a second input terminal that floats.

10. The circuit of claim 8 wherein said baseband processor further comprises an analog-to-digital converter and a memory.

11. A method of converting an RF signal to a baseband signal, the method comprising:

attenuating the RF signal in response to a feedback signal to generate a first signal;

amplifying the first signal in response to the feedback signal to generate a second signal;

bandpass filtering the second signal to generate a third signal, said bandpass filtering being performed using a tracking filter that comprises:

an inductor coupled between a first node and a second node;

N capacitors each having a terminal coupled to the first node;

N first switches each associated with a different one of the N capacitors, each of the N first switches adapted to couple a second terminal of its associated capacitor to the second node when closed;

converting a frequency of the third signal from RF to baseband; and generating the feedback signal in response to a strength of the second signal.

12. The method of claim 11 further comprising:

using a mixer to convert the frequency of the third signal, said mixer having a single-ended input terminal and a differential output terminal.

13. The method of claim 11 further comprising:

filtering out high frequency signals from the baseband signal to generate a fourth signal.

14. The method of claim 12 wherein said tracking filter further comprises:

a current source having a first terminal coupled to a third node; and a second switch adapted to enable a current to flow from the second node to the third node when it is closed.

15. The method of claim 12 further comprising using a baseband processor to generate the feedback signal in response to the second and fourth signals.

16. The method of claim 15 wherein said baseband processor is adapted to close the second switch and the N first switches in a predefined sequence when a channel change occurs so as to determine switch positions that cause a highest amplitude for the third signal.

17. The method of claim 16 further comprising using a variable gain low-noise variable gain amplifier to amplify the first signal.

18. The method of claim 17 further wherein the variable gain low-noise amplifier further comprises an attenuator whose attenuation level is varied in response to the feedback signal.

19. The method of claim 12 wherein said mixer comprises a first input terminal receiving an output signal of the variable gain amplifier and a second input terminal that floats.

20. The method of claim 18 wherein said baseband processor further comprises an analog-to-digital converter and a memory.

* * * * *